United States Patent
Jacques et al.

(10) Patent No.: US 7,080,339 B2
(45) Date of Patent: Jul. 18, 2006

(54) PLANE REPRESENTATION OF WIRING IN A DESIGN LAYOUT

(75) Inventors: Etienne Jacques, Palo Alto, CA (US); Tom Kronmiller, Chapel Hill, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 19 days.

(21) Appl. No.: 10/443,811

(22) Filed: May 21, 2003

(65) Prior Publication Data

US 2004/0225989 A1    Nov. 11, 2004

Related U.S. Application Data

(60) Provisional application No. 60/468,926, filed on May 7, 2003.

(51) Int. Cl.
  *G06F 17/50* (2006.01)
(52) U.S. Cl. .................. 716/12; 716/1; 716/9; 716/11; 716/13
(58) Field of Classification Search ..................... 716/2, 716/7, 1, 9–13; 707/2
See application file for complete search history.

(56) References Cited

U.S. PATENT DOCUMENTS

| | | | |
|---|---|---|---|
| 5,452,224 A | 9/1995 | Smith et al. | |
| 5,508,938 A | 4/1996 | Wheeler | |
| 5,519,633 A | 5/1996 | Chang et al. | |
| 5,757,656 A | 5/1998 | Hershberger et al. | |
| 6,301,686 B1 | 10/2001 | Kikuchi | |
| 6,317,864 B1 | 11/2001 | Kikuchi et al. | |
| 6,385,758 B1 * | 5/2002 | Kikuchi et al. ................ | 716/2 |
| 6,453,444 B1 | 9/2002 | Shepard | |
| 6,609,242 B1 | 8/2003 | Slade | |
| 6,629,302 B1 | 9/2003 | Miura et al. | |
| 6,701,306 B1 * | 3/2004 | Kronmiller et al. ............ | 707/2 |
| 6,779,167 B1 | 8/2004 | Igarashi | |

(Continued)

OTHER PUBLICATIONS

International Search Report, Jan. 24, 2005.

*Primary Examiner*—Thuan Do
(74) *Attorney, Agent, or Firm*—Stattler Johansen & Adeli LLP

(57) ABSTRACT

Some embodiments of the invention provide a method of specifying routes in a design layout, where each route has a set of segments and each segment has a shape. The method receives a route, and for each segment of the received route, identifies n half planes that when intersected provide the shape of the segment. In some embodiments, n is an integer greater than 4. Some embodiments provide a method of generating a representation of a route formed by several adjoining polygons. For each polygon, this method (1) identifies a direction for the polygon, (2) defines a segment along the identified direction, where the segment has a starting point and an ending point, and (3) identifies more than four values that specify more than four half planes in conjunction with the starting and ending points of the segment, where the intersection of the specified half planes provides the shape of the polygon. Some embodiments provide a design layout that has several routes that are each represented by a set of segments. Each particular segment has an associated shape, which is specified by a data-storage index for the particular segment. Each particular data-storage index identifies a particular set of n values that are stored in a data storage, where, in some embodiments, n is an integer greater than 4.

16 Claims, 14 Drawing Sheets

U.S. PATENT DOCUMENTS

| | | |
|---|---|---|
| 6,797,999 B1 | 9/2004 | Hou et al. |
| 6,813,756 B1 | 11/2004 | Igarashi et al. |
| 6,996,793 B1 * | 2/2006 | Kronmiller et al. ............ 716/9 |
| 2003/0121017 A1 | 6/2003 | Andreev |
| 2004/0210862 A1 | 10/2004 | Igarashi |
| 2004/0225983 A1 | 11/2004 | Jacques |
| 2004/0225990 A1 | 11/2004 | Jacques |

* cited by examiner

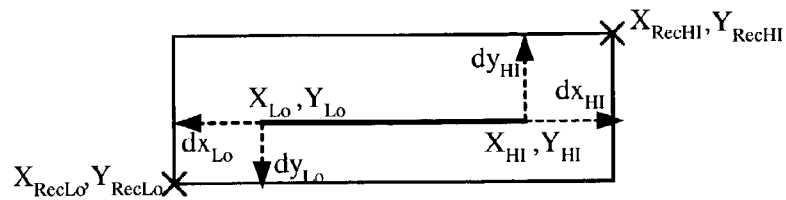
Figure 1
*Prior Art*
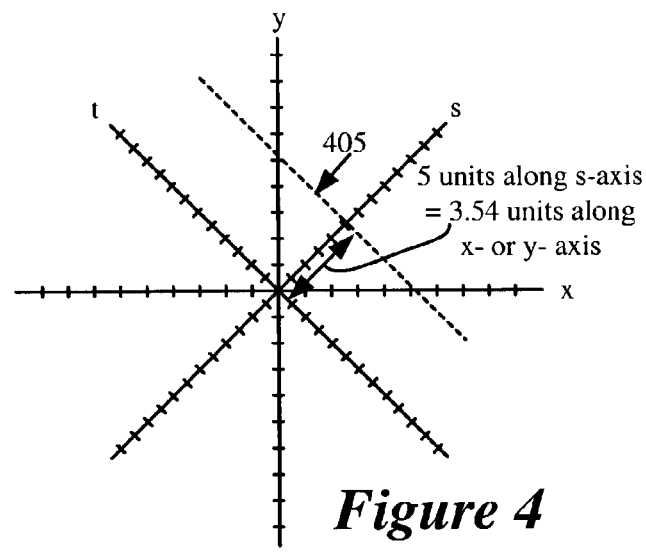
Figure 2
Figure 4
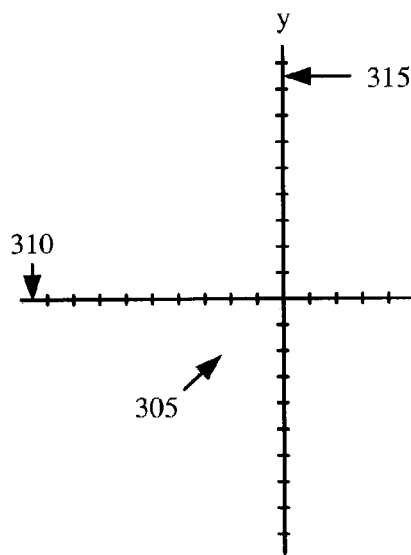
Figure 3

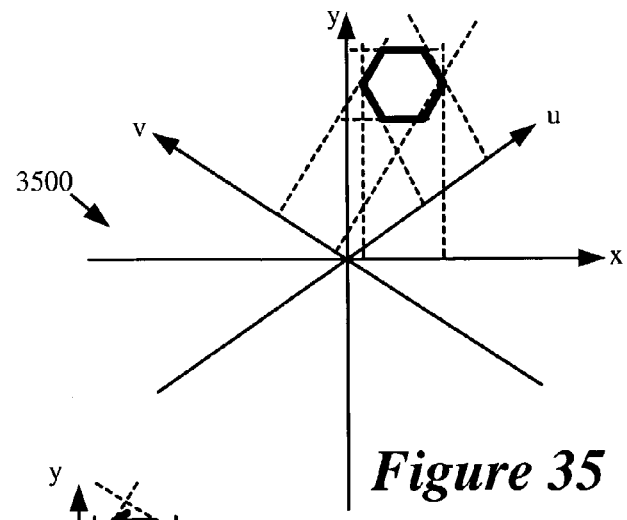
Figure 34
Figure 35
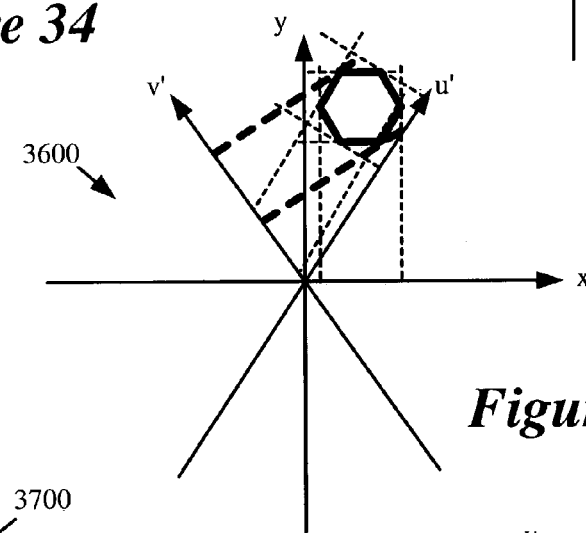
Figure 36
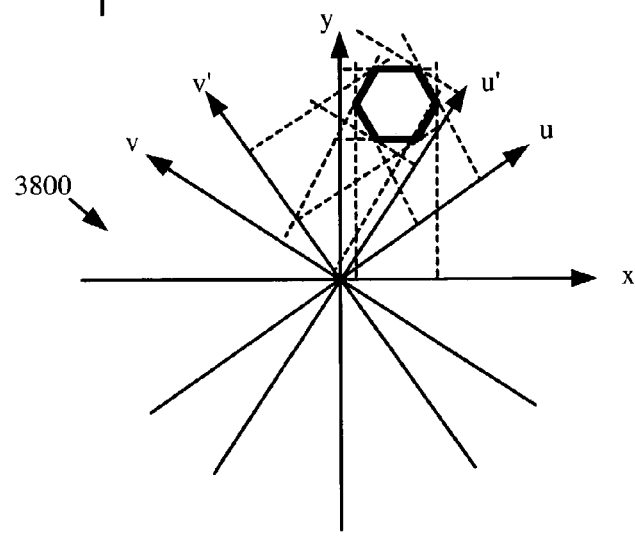
Figure 37
Figure 38

PLANE REPRESENTATION OF WIRING IN A DESIGN LAYOUT

CLAIM OF BENEFIT

This application claims the benefit of U.S. Provisional Patent Application No. 60/468,926, entitled "Method and Apparatus for Representing Items in a Design Layout," filed on May 7, 2003. This provisional application is incorporated herein by reference.

FIELD OF THE INVENTION

The invention is directed towards representation of wiring in a design layout.

BACKGROUND OF THE INVENTION

Design engineers design IC's by transforming circuit description of the IC's into geometric descriptions, called layouts. To create layouts, design engineers typically use electronic design automation ("EDA") applications. These applications provide sets of computer-based tools for creating, editing, and analyzing IC design layouts. EDA applications create layouts by using geometric shapes that represent different materials and devices on IC's. For instance, EDA tools commonly represent IC components as rectangular objects. They also use rectangles to represent horizontal and vertical interconnections between rectangular IC components. The horizontal and vertical interconnects are referred to as Manhattan interconnects or wiring.

EDA tools typically represent a rectangular object in terms of x and y coordinates of two opposing vertices of the object (i.e., in terms of $x_{LO}$, $y_{LO}$, and $x_{HI}$, $y_{HI}$). These tools often represent a non-rectangular object in terms of the x- and y-coordinates of the object's vertices. Such an approach works well when most of the shapes in the layout are rectangular.

However, certain EDA tools have recently been proposed that support non-Manhattan wiring. These tools often utilize a large number of non-rectangular shapes. The traditional approach of specifying a shape in terms of the coordinates of two or more of its vertices is not efficient for these newer EDA tools. Therefore, there is a need for a novel way of specifying items in a design layout that has non-rectangular shapes.

There is also a need for an efficient way of representing routes with non-Manhattan edges. One prior technique for representing a Manhattan route specifies the route in terms of a set of segments and one or more styles. Each segment is a straight line that connects two points in the design layout. In some cases, the segments of a route are run-length encoded. This encoding specifies a direction and a length for each segment. In such prior encoding, a segment's direction can be along 0°, 90°, 180°, and 270°. This encoding also specifies an order for the segments of the route.

Each segment's style specifies four values that can be used to transform a line-representation of the segment into a rectangular shape that is a more complete geometric representation of the segment. These four values include two low delta values, $dx_{LO}$ and $dy_{LO}$, and two high delta values, $dx_{HI}$, and $dy_{HI}$. The low delta values are subtracted from the segment's lowest x- and y-values $x_{LO}$, $y_{LO}$ to obtain the low x- and y-values ($x_{RecLO}$, $y_{RecLO}$) of rectangle that represents the segment, while the high delta values are added to the segment's highest x- and y-values $x_{HI}$, $y_{HI}$ to obtain the high x- and y-values ($x_{RecHI}$, $y_{RecHI}$) of the rectangle. FIG. 1 illustrates an example of constructing the rectangle for a segment from the coordinates and style values of the segment. This prior technique, however, does not support non-Manhattan routes. Accordingly, there is a need for an efficient representation of routes that can have non-Manhattan edges.

SUMMARY OF THE INVENTION

Some embodiments of the invention provide a method of specifying routes in a design layout, where each route has a set of segments and each segment has a shape. The method receives a route, and for each segment of the received route, identifies n half planes that when intersected provide the shape of the segment. In some embodiments, n is an integer greater than 4.

Some embodiments provide a method of generating a representation of a route formed by several adjoining polygons. For each polygon, this method (1) identifies a direction for the polygon, (2) defines a segment along the identified direction, where the segment has a starting point and an ending point, and (3) identifies more than four values that specify more than four half planes in conjunction with the starting and ending points of the segment, where the intersection of the specified half planes provides the shape of the polygon.

Some embodiments provide a design layout that has several routes that are each represented by a set of segments. Each particular segment has an associated shape, which is specified by a data-storage index for the particular segment. Each particular data-storage index identifies a particular set of n values that are stored in a data storage, where, in some embodiments, n is an integer greater than 4.

BRIEF DESCRIPTION OF THE DRAWINGS

The novel features of the invention are set forth in the appended claims. However, for purpose of explanation, several embodiments of the invention are set forth in the following figures.

FIG. 1 illustrates an example of constructing the rectangle for a segment from the coordinates and style values of the segment.

FIG. 2 illustrates an octangle data structure used in some embodiments of the invention.

FIG. 3 illustrates two coordinates systems used to define the parameters of the octangle data structure.

FIG. 4 illustrates a −45° diagonal line that can be represented by an equation that is defined by reference to one of the coordinate systems illustrated in FIG. 3.

FIGS. 34–38 illustrate some alternative data structures and coordinate systems that are used by some embodiments of the invention.

DETAILED DESCRIPTION OF THE INVENTION

Figure 5:
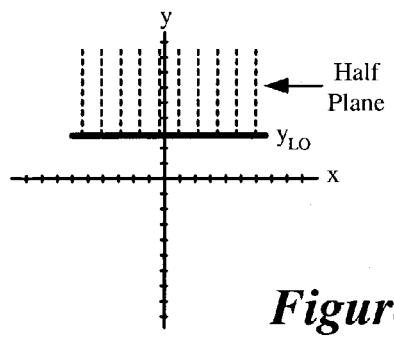
FIGS. 5–12 illustrate eight half planes that are defined by the eight parameters of the octangle data structure illustrated in FIG. 2.
Figure 9:
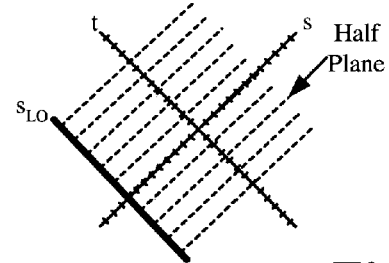
Figure 6:
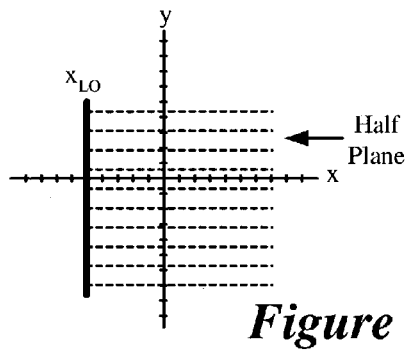
Figure 10:
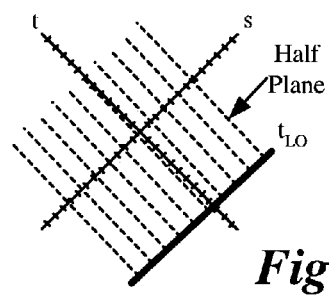
Figure 7:
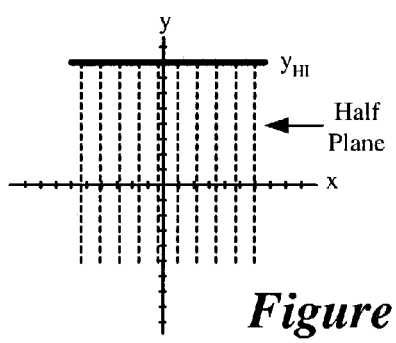
Figure 11:
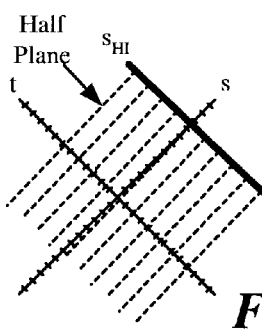
Figure 8:
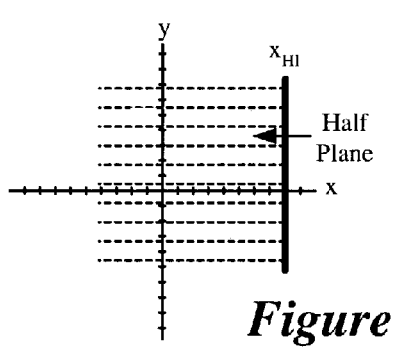
Figure 12:
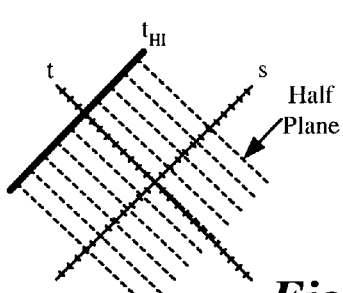

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide novel methods for representing items in a design layout. For instance, some embodiments use a method that represents an item in terms of n-values that define n-half planes, which when intersected define the shape of the item. In some embodiments, n is a number greater than four.

Some embodiments use a method that (1) identifies a first set of location data for the item with respect to a first coordinate system, (2) identifies a second set of location data for the item with respect to a second coordinate system, and (3) specifies the item in terms of the first and second set of location data. In some embodiments, both the first and second coordinate systems have first and second coordinate axes. In some of these embodiments, the first set of location data are the highest and lowest coordinates of the item on the first and second coordinate axes of the first coordinate system, while the second set of location data are the highest and lowest coordinates of the item on the first and second coordinate axes of the second coordinate system.

Some embodiments use a method that (1) receives a first set of data that defines the item with respect to a first coordinate system of the design layout, (2) from the first set of data, generates a second set of data that defines the item with respect to a second coordinate system of the design layout, and (3) specifies the item in terms of both the first and second sets of data.

In some of the embodiments mentioned above, the first coordinate system is a Manhattan coordinate system, while the second coordinate system is a non-Manhattan coordinate system. In other embodiments, the first coordinate system is a non-Manhattan coordinate system, while the second coordinate system is a Manhattan coordinate system.

I. Octangle Data Structure

Some embodiments of the invention provide novel data structures and processes that efficiently store convex geometric shapes in a design layout, when at least some convex geometric shapes have at least two sides that are neither parallel nor orthogonal to each other. In some embodiments, each possible side of the shapes is one of the manufacturing directions. As used in this document, the term "manufacturing" refers to the process used to manufacture an IC from its EDA design. Hence, manufacturing directions are the directions available to the manufacturing process to produce an IC from an EDA design (e.g., to specify the shapes of cells, pins, interconnects, etc. from the EDA design).

FIGS. 2–25 illustrate the data structure and processes of some embodiments. The data structure illustrated in these figures is referred to below as the octangle data structure, as it is useful for design layouts that have items with horizontal, vertical, and/or ±45° directions. In the description below, both the wiring and non-wiring geometries of the design layout are convex shapes, or can be decomposed into convex shapes, that can have horizontal, vertical, and ±45° sides. One of ordinary skill will realize, however, that some embodiments might use the octangle data structure in cases where the wiring or non-wiring geometries are more restricted. For instance, this data structure might be used when the wiring is only in the Manhattan directions or in the ±45° directions, or the non-wiring geometries (e.g., pins and obstacles) have sides along only in the Manhattan directions or the ±45° directions. The discussion below focuses on convex polygonal shapes as it assumes that any non-convex shapes can be broken down into convex polygonal shapes.

As illustrated in FIG. 2, the octangle data structure 205 represents each convex geometric shape in terms of eight values, $x_{LO}$, $y_{LO}$, $s_{LO}$, $t_{LO}$, $x_{HI}$, $y_{HI}$, $s_{HI}$, and $t_{HI}$. These eight values define eight half plane in two coordinate systems. Before describing how 8-half planes define a convex geometric shape, the two coordinate systems are briefly described. FIG. 3 illustrates the two coordinates systems. As shown in this figure, one coordinate system is a Manhattan coordinate system 305, which is formed by an x-axis 310 and y-axis 315. The other coordinate system is a 45°-rotated coordinate system 320, which is formed by an s-axis 325 and t-axis 330. The s-axis is at a 45° counterclockwise rotation from the x-axis 310, while the t-axis is at a 135° counterclockwise rotation from the x-axis 310. In the layouts of some embodiments, horizontal lines are aligned with the x-axis, vertical lines are aligned with the y-axis, 45° diagonal lines are aligned with the s-axis, and −45° diagonal lines are aligned with the t-axis.

In some embodiments, the Manhattan coordinate system is aligned with the manufacturing grid. Also, some embodiments define the unit length along the s- and t-axes to be $$\frac{\sqrt{2}}{2}$$

times the unit length along the x- and y-axes, so that the diagonal coordinate system is also aligned with manufacturing grid. In other words, the coordinate resolution along the diagonal coordinate system 320 is selected such that diagonal lines that traverse through integer diagonal coordinates can start and terminate on the manufacturing grid, and can intersect, on the manufacturing grid, the Manhattan lines that traverse through integer Manhattan coordinates. For instance, FIG. 4 illustrates a −45° diagonal line 405 that can be represented by the equation, $$s=5.$$

This line 405 intersects the Manhattan coordinate system at (0, 5) and (5,0). As shown in FIG. 4, 5 units along the s-axis is equivalent to $$5 * \frac{\sqrt{2}}{2},$$

or 3.54, units along the Manhattan coordinate system. Given that the unit length along the s- and t-axes is $$\frac{\sqrt{2}}{2}$$

times the unit length along the x- and y-axes, the following coordinate-transform equations (A) and (B) can be used to obtain the s- and t-coordinates of any point from the points x- and y-coordinates.

$$s = x+y, \text{ and} \qquad (A)$$

$$t = y-x. \qquad (B)$$

As mentioned above, the octangle data structure 205 represents each convex geometric shape in terms of 8 values, where each value defines a half plane that is defined in the design layout by reference to one of the two coordinate systems 305 and 320. FIG. 2 identifies these 8 values as $x_{LO}$, $y_{LO}$, $s_{LO}$, $t_{LO}$, $x_{HI}$, $y_{HI}$, $s_{HI}$, and $t_{HI}$. The values $x_{LO}$, $y_{LO}$, $s_{LO}$, $t_{LO}$ are the smallest coordinates of the shape along the x-, y-, s-, and t-axes (i.e., the smallest x-, y-, s-, and t-axis values of the shape), while $x_{HI}$, $y_{HI}$, $s_{HI}$, and $t_{HI}$ are the largest coordinates of the shape along the x-, y-, s-, and t-axes (i.e., the largest x-, y-, s-, and t-axis values of the shape). As illustrated in FIGS. 5–12, the low values (i.e., $x_{LO}$, $y_{LO}$, $s_{LO}$, $t_{LO}$) specify a half-plane to the positive side (i.e., the right or top side) of the value, while the positive values (i.e., $x_{HI}$, $y_{HI}$, $s_{HI}$, and $t_{HI}$) specify a half-plane to the negative side (i.e., the left or bottom side) of the value. (Each of these figures illustrates its half plane as a set of dashed lines that terminate on a solid line.) The intersection of these 8 half-planes defines a convex geometric shape. Specifically, the eight values $x_{LO}$, $y_{LO}$, $s_{LO}$, $t_{LO}$, $x_{HI}$, $y_{HI}$, $s_{HI}$, and $t_{HI}$ define a convex geometric shape $$S(x,y)$$
$$\in R^2$$

where:

$$x_{LO} \leq x \leq x_{HI},$$

$$y_{LO} \leq y \leq y_{HI},$$

$$s_{LO} \leq s \leq s_{HI},$$

$$t_{LO} \leq t \leq t_{HI},$$

$$s = x+y, \text{ and}$$

$$t = y-x.$$

Figure 13:
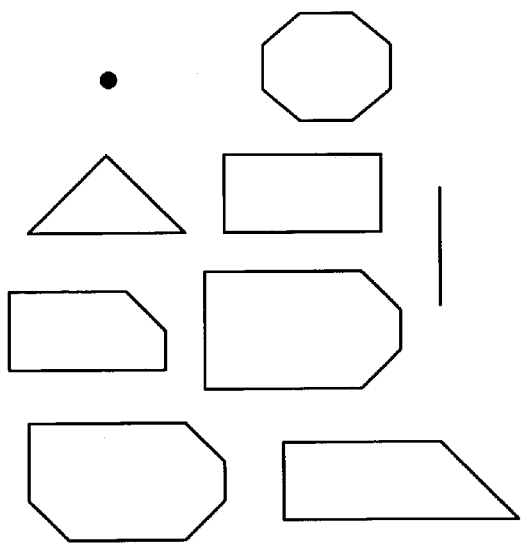
FIG. 13 illustrates examples of the types of shapes that the octangle data structure of FIG. 2 can represent.
Figure 14:
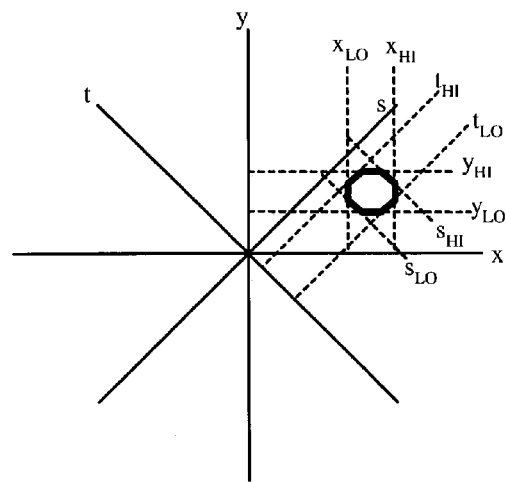
FIGS. 14–22 illustrate how the shapes illustrated in FIG. 13 are represented by the eight half-plane values.
Figure 15:
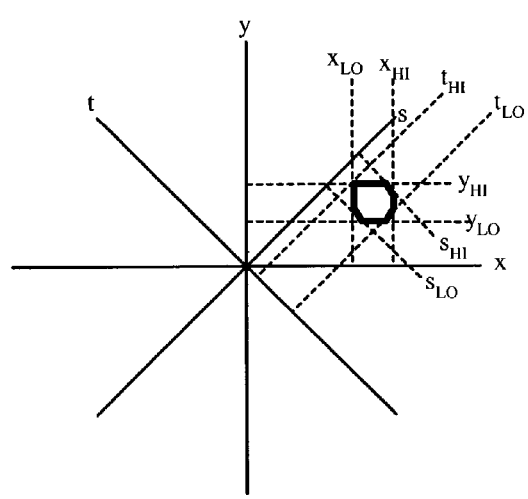
Figure 16:
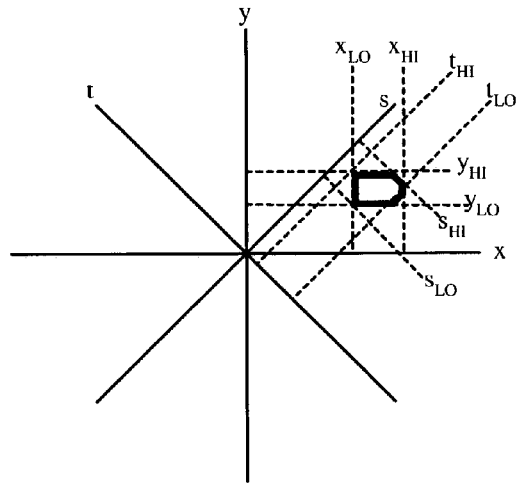
Figure 17:
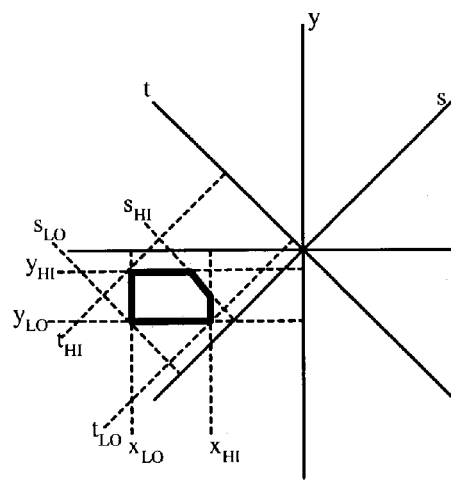
Figure 18:
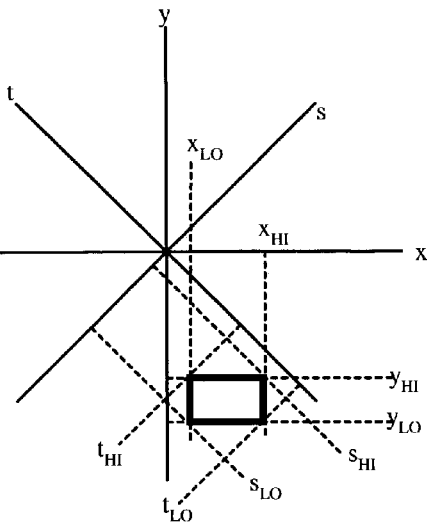
Figure 19:
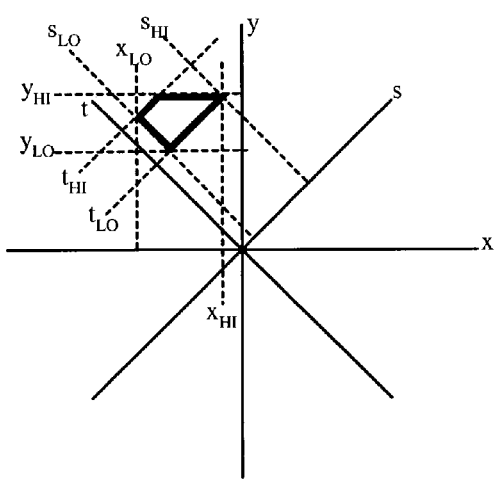
Figure 20:
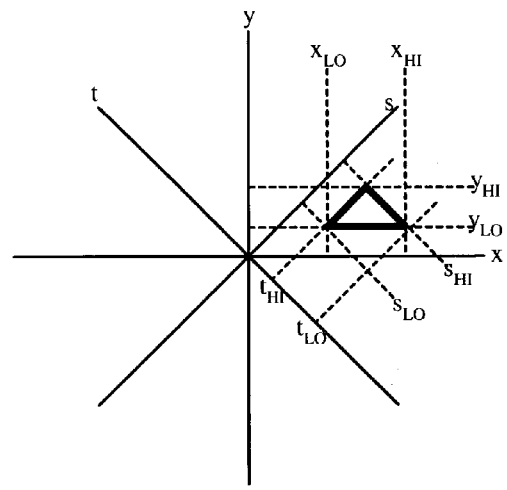
Figure 21:
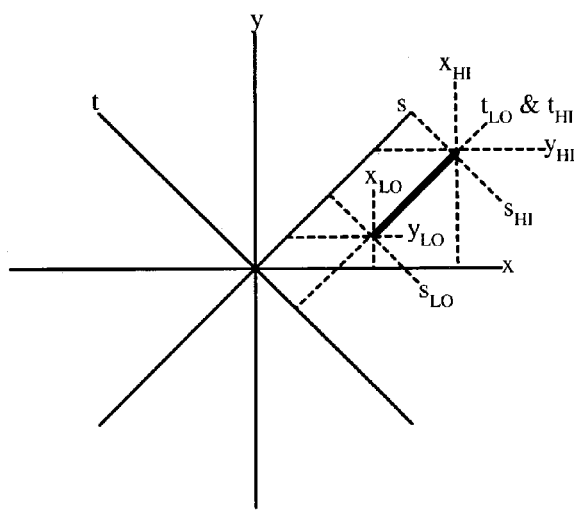
Figure 22:
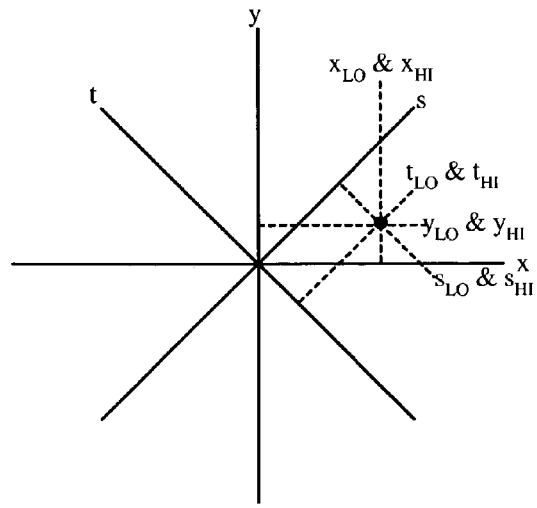

FIG. 13 illustrates examples of the types of shapes that the octangle data structure 205 can represent. As shown in this figure, this data structure can represent a single point, a line, or any convex polygon that has anywhere from three to eight sides in 8 possible directions. FIGS. 14-22 illustrate how the shapes illustrated in FIG. 13 are represented by the 8 half-plane values $x_{LO}$, $y_{LO}$, $s_{LO}$, $t_{LO}$, $x_{HI}$, $y_{HI}$, $s_{HI}$, and $t_{HI}$. (To simplify these drawings, FIGS. 14–22 illustrate each half plane by a dashed line that represents the line on which the half plane terminates.) The polygonal shapes illustrated in FIGS. 13–22 can represent any number of items in the design layout. These items include cells, circuits, circuit components (such as devices like transistors, capacitors, etc.), obstacles, vias, pins, bounding polygons, regions of interest, routes, etc. For instance, the polygon in FIG. 16 might be all or a portion of a cell, a circuit, a circuit component, an obstacle, a pin, a via, a bounding polygon, a region of interest, or a route, etc.

When a convex geometric shape has less than eight sides, one or more of the eight half planes, of the octangle data structure are superfluous (i.e., are not necessary to uniquely identify the boundaries of the shape). For instance, the half plane $t_{HI}$ is superfluous in FIG. 15, the half planes $t_{HI}$ and $s_{LO}$ are superfluous in FIG. 16, the half planes $t_{HI}$, $t_{LO}$, and $s_{LO}$ are superfluous in FIG. 17, and so on. When one of the eight half planes is superfluous, it is canonically defined to abut one of the vertices of the geometric shape. This canonical definition is part of the above-mentioned definition of the eight half-plane values $x_{LO}$, $y_{LO}$, $s_{LO}$, $t_{LO}$, $x_{HI}$, $y_{HI}$, $s_{HI}$, and $t_{HI}$. As mentioned above, the values $x_{LO}$, $y_{LO}$, $s_{LO}$, $t_{LO}$ are defined as the smallest coordinates of the shape along the x-, y-, s-, and t-axes (i.e., the smallest x-, y-, s-, and t-axis values of the shape), while $x_{HI}$, $y_{HI}$, $s_{HI}$, and $t_{HI}$ are defined as the largest coordinates of the shape along the x-, y-, s-, and t-axes (i.e., the largest x-, y-, s-, and t-axis values of the shape).

Figure 23A:
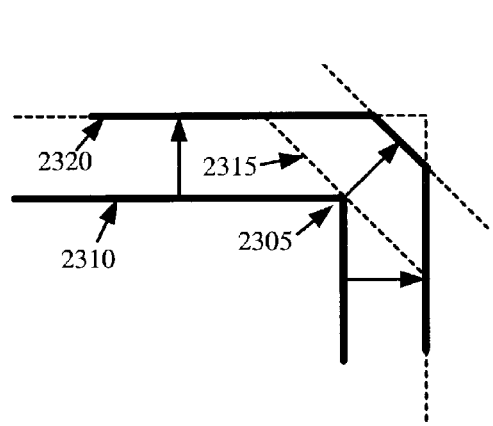
FIGS. 23A and 23B illustrate an example that illustrated why some embodiments define a superfluous half plane of the octangle data structure to abut one of the vertices of the. geometric shape defined by the octangle data structure.
Figure 23B:
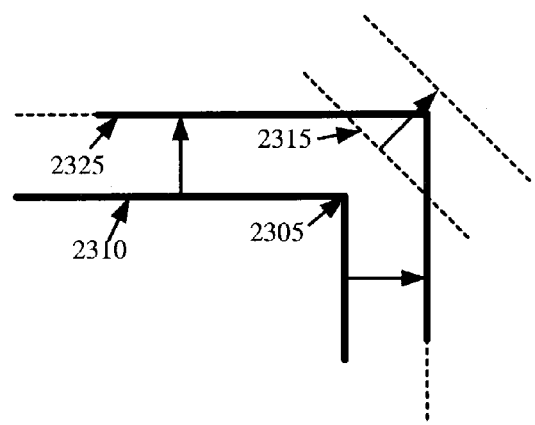

Some embodiments define a superfluous half plane to abut one of the vertices of the geometric shape in order to ensure that future calculations that are performed on the shape provide accurate results. FIGS. 23A and 23B illustrate an example of this. These figures present the vertex 2305 of a geometric shape 2310 and a superfluous half plane 2315 that is defined by the $s_{HI}$ parameter. In FIG. 23A, the $s_{HI}$ for the half plane 2315 correctly abuts the vertex 2305. Hence, as shown in FIG. 23A, an expansion operation that expands the sides of the geometric shape 2310 by a particular factor, results in a new geometric shape 2320 that correctly has a −45° side (due to the expansion of the half plane 2315) on its upper right hand corner. FIG. 23B, on the other hand, illustrates the $s_{HI}$ for the half plane 2315 to be incorrectly positioned away from the vertex 2305. Consequently, an expansion operation on this representation incorrectly results in a new geometric shape 2325 that still has a 900 juncture at the upper left corner of the new geometric shape 2325. Expansion operations are further described in U.S. Patent Application entitled "Method and Apparatus for Representing Items in a Design Layout" filed concurrently with this application having Ser. No. 10/443,811**. This non-provisional application is incorporated herein by reference and is referred to below in several instances as the "above-incorporated non-provisional application."

Another advantage of defining a superfluous half plane to abut one of the vertices of the geometric shape is that this definition simplifies the identification of bounding polygons and the computation of their widths. As further described in the above-incorporated non-provisional application, the octangle data structure allows EDA tools to quickly identify the octilinear bounding polygon for a set of items in the design layout. From the octilinear bounding polygon, the rectilinear Manhattan bounding box can be quickly identified by simply taking the low and high x and y-values $x_{LO}$, $y_{LO}$, $x_{HI}$, $Y_{HI}$ of the octilinear bounding polygon. Similarly, the 45°-rotated bounding box can be quickly identified by simply taking the low and high s- and t-values $s_{LO}$, $t_{LO}$, $s_{HI}$, and $t_{HI}$ of the octilinear bounding polygon. Also, the width of each of these bounding polygons in a particular direction can be quickly computed by subtracting the box's low value from the box's high value in the particular direction.

The octangle data structure 205 can be used to define design-layout items that are in shape of points, lines, or a variety of convex polygons. Examples of such items include cells, circuits, circuit components (such as devices like transistors, capacitors, etc.), vias, obstacles, pins, bounding polygons, regions of interest, and routes. When a design-layout item is represented by a non-convex shape that is decomposable into two or more convex shapes, the design-layout item is defined by two or more octangle data structures, where each octangle data structure represents one of the convex shapes that forms the item.

Some embodiments use essentially similar processes to create the octangle data structure for cells, circuits, circuit components, vias, obstacles, pins, bounding polygons, and regions of interest, but use a slightly more efficient approach for representing routes. In the description below, the creation of the more general octangle data structure will be first described below. This description will then be followed by a description of the efficient representation of routes in some embodiments of the invention.

Figure 24:
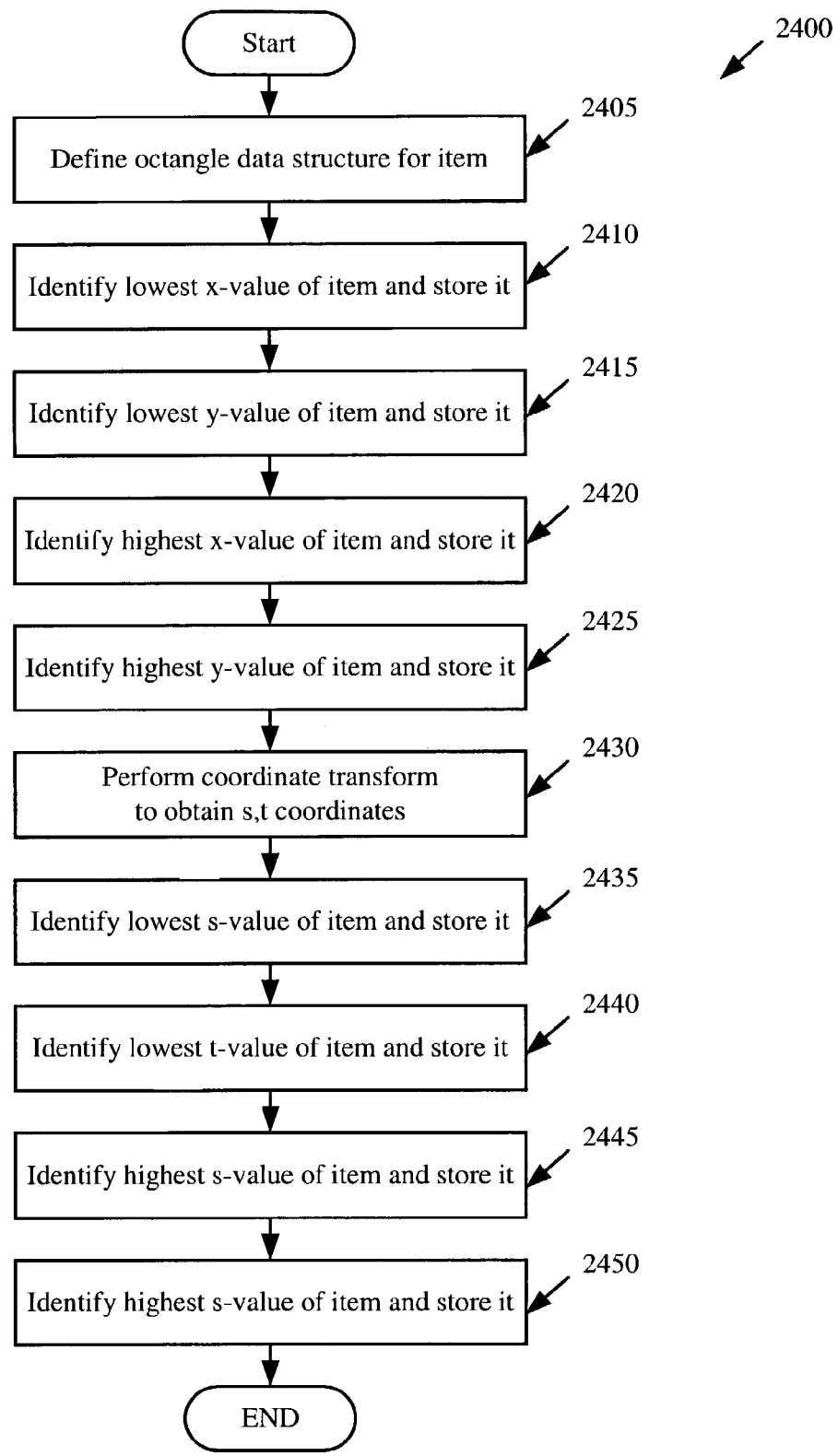
FIG. 24 illustrates a process that defines an octangle data structure for a design-layout item that is initially defined in terms of the x- and y-coordinates of its vertices.

FIG. 24 illustrates a process 2400 that defines an octangle data structure for a design-layout item that is initially defined in terms of the x- and y-coordinates of its vertices. The design-layout item can be any item in the layout, such as a cell, a circuit, a circuit component, a via, an obstacle, a pin, a bounding polygon, a route and a region of interest. In some cases, the item is defined only in terms of two of its vertices. For instance, in some cases, the item is a rectangle that is initially defined only in terms of x- and y-coordinates of two of its opposing corners (i.e., only in terms of $x_{LO}$, $y_{LO}$, and $x_{HI}$, $Y_{HI}$). Alternatively, the item might be defined in terms of three or more of its vertices. For example, the item might be a polygon that is defined in terms of the x- and y-coordinates of each of its vertices.

As shown in FIG. 24, the process 2400 initially defines (at 2405) an octangle data structure 205 for the design-layout item. At 2410 and 2415, the process then identifies the lowest x- and y-values of the item, and stores these values as the $x_{LO}$ and $y_{LO}$ values in the octangle data structure 205. The item's lowest x- and y-values are respectively the smallest x-coordinate and the smallest y-coordinate of the item's vertices.

At 2420 and 2425, the process then identifies the highest x- and y-values of the item, and stores these values as the $x_{HI}$ and $y_{HI}$ values in the octangle data structure 205. The item's highest x- and y-values are respectively the largest x-coordinate and the largest y-coordinate of the item's vertices.

The process then performs (at 2430) a coordinate-transform operation. From the x- and y-coordinates of the vertices of the design-layout item, the coordinate-transform operation (at 2430) produces an s- ant t-coordinates for each vertex of the design-layout item. The process produces the s- and t-coordinates for a particular vertex from the x- and y-coordinates of the particular vertex by using the above-described coordinate-transform equations (A) and (B). Also, when the item was initially defined in terms of the x- and y-coordinates of only two of its vertices, the process initially identifies (at 2430) the x- and y-coordinates of the other vertices of the item, and then performs (at 2430) its coordinate-transform operation.

At 2435 and 2440, the process then identifies the smallest s- and t-values of the vertices of the item (i.e., the smallest s- and t-values computed at 2430), and stores these values as the $s_{LO}$ and $t_{LO}$ values in the octangle data structure 205. At 2445 and 2450, the process next identifies the largest s- and t-values of the vertices of the item (i.e., the largest s- and t-values computed at 2430), and stores these values as the $s_{HI}$ and $t_{HI}$ values in the octangle data structure 205. After 2450, the process ends.

The process 2400 of FIG. 24 can also be used to define an octangle data structure that represents an octilinear-bounding polygon of a set of design-layout items that are each defined in terms of the x- and y-coordinates of two or more vertices. When the process 2400 is used in such a manner, the process 2400 in some embodiments (1) identifies the bounding polygon's $x_{LO}$, $y_{LO}$, $x_{HI}$, and $y_{HI}$ values by examining (at 2410-2425) the vertices of all the items in the set of design-layout items, (2) performs (at 2430) coordinate transform operations on all the vertices of all the items in the set, and (3) identifies the bounding polygon's $s_{LO}$, $t_{LO}$, $s_{HI}$ and $t_{HI}$ values by examining (at 2435-2450) the vertices of all the items in the set of design-layout items.

Figure 25:
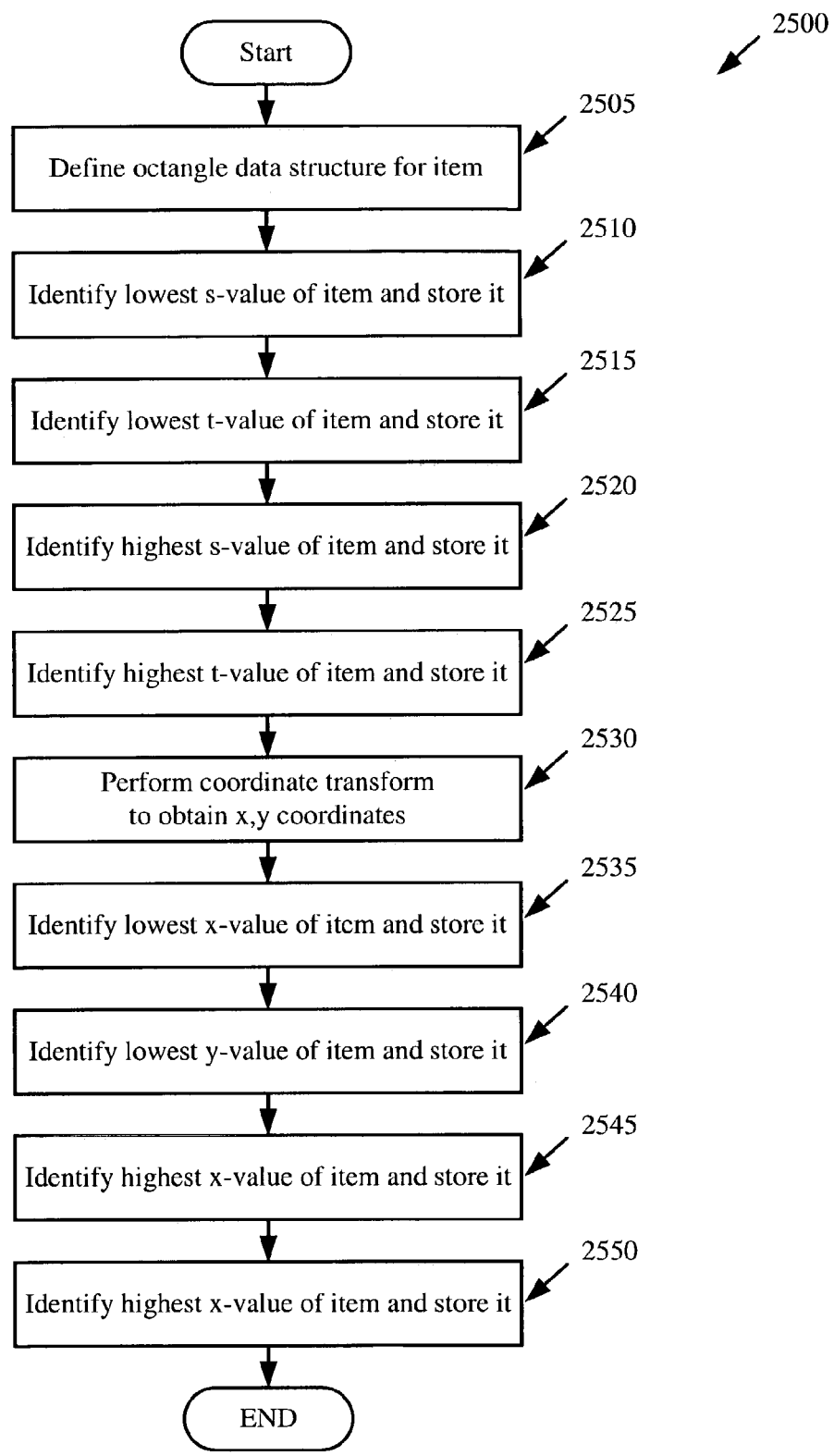
FIG. 25 illustrates a process that defines an octangle data structure for a design-layout item that is initially defined in terms of the s- and t-coordinates of its vertices.

FIG. 25 illustrates a process 2500 that defines an octangle data structure for a design-layout item that is initially defined in terms of the s- and t-coordinates of its vortices. The design-layout item can be any item in the layout, such as a cell, a circuit, a circuit component, a via, an obstacle, a pin, a bounding polygon, a route, a region of interest, etc. In some cases, the item is defined only in terms of two of its vertices. For instance, in some cases, the item is a rotated rectangle that is initially defined only in terms of s- and t-coordinates of two of its opposing corners (i.e., only in terms of $s_{LO}$, $t_{LO}$, and $s_{HI}$, $t_{HI}$). Alternatively, the item might be defined in terms of three or more of its vertices. For example, the item might be a polygon that is defined in terms of the s- and t-coordinates of each of its vertices.

As shown in FIG. 25, the process 2500 initially defines (at 2505) an octangle data structure 205 for the design-layout item. At 2510 and 2515, the process then identifies the lowest s- and t-values of the item, and stores these values as the $s_{LO}$ and $t_{LO}$ values in the octangle data structure 205. The item's lowest s- and t-values are respectively the smallest s-coordinate and the smallest t-coordinate of the item's vertices.

At 2520 and 2525, the process then identifies the highest s- and t-values of the item, and stores these values as the $S_{HI}$ and $t_{HI}$ values in the octangle data structure 205. The item's highest s- and t-values are respectively the largest s-coordinate and the largest t-coordinate of the item's vertices.

The process then performs (at 2530) a coordinate-transform operation. From the s- and t-coordinates of the vertices of the design-layout item, the coordinate-transform operation (at 2530) produces an x- ant y-coordinates for each vertex of the design-layout item. The process produces the x- and y-coordinates for a particular vertex from the s- and t-coordinates of the particular vertex by using the following coordinate-transform equations (C) and (D), which are derived from the above-described equations (A) and (B).

$$x=\tfrac{1}{2}(s-t), \text{ and} \tag{C}$$

$$y=\tfrac{1}{2}(s+t). \tag{D}$$

Also, if the item was initially defined in terms of the s- and t-coordinates of only two of its vertices, the process initially identifies (at 2530) the s- and t-coordinates of the other vertices of the item, and then performs (at 2530) its coordinate-transform operation.

At 2535 and 2540, the process then identifies the smallest x- and y-values of the vertices of the item (i.e., the smallest x- and y-values computed at 2530), and stores these values as the $x_{LO}$ and $y_{LO}$ values in the octangle data structure 205. At 2545 and 2550, the process next identifies the largest x- and y-values of the vertices of the item (i.e., the largest x- and y-values computed at 2530), and stores these values as the $x_{HI}$ and $y_{HI}$ values in the octangle data structure 205. After 2550, the process ends.

The process 2500 of FIG. 25 can be used to define an octangle data structure that represents an octilinear-bounding polygon of a set of design-layout items that are each defined in terms of the s- and t-coordinates of two or more vertices. When the process 2500 is used in such a manner, the process 2500 in some embodiments (1) identifies the polygon's $s_{LO}$, $t_{LO}$, $s_{HI}$ and $t_{HI}$ values by examining (at 2510-2525) the vertices of all the items in the set of design-layout items, (2) performs (at 2530) coordinate transform operations on all the vertices of all the items in the set, and (3) identifies the polygon's $x_{LO}$, $y_{LO}$, $x_{HI}$ and $y_{HI}$ values by examining (at 2535-2550) the vertices of all the items in the set of design-layout items.

It might be necessary to identify the octilinear-bounding polygon of a set of design-layout items that includes (1) a first sub-set of items that are defined in terms of the x- and y-coordinates of two or more of their vertices, and (2) a second sub-set of items that are defined in terms of the s- and t-coordinates of two or more of their vertices. In such a case, some embodiments perform two sets of coordinate transform operations initially to obtain x-, y-, s- and t-vertex coordinates for each item in the set. These embodiments then identify the smallest and largest x-, y-, s- and t-vertex coordinate values in the set and store these values in an octangle data structure. The initial coordinate-transform operations are not needed when each item in the set is expressed in terms of x-, y-, s-, and t-coordinates.

In some cases, some embodiments do not perform the process 2400 or the process 2500 to identify the octangle data structure of a design-layout item. Instead, in such cases, these embodiments define the octangle data structure while defining the design-layout item. For instance, such is the case when some embodiments define an item based on a user's input.

II. Representation of Routes

Some embodiments of the invention define each route in terms of one or more segments and one style for each segment. Each segment is a straight line that connects two points in the design layout. Some embodiments run-length encode the segments of a route. Such an encoding specifies each segment in terms of a direction D and a length L. A segment's direction can be along any of the 8 available routing directions, which are 0°, 45°, 90°, 135°, 180°, 225°, 270°, and 315°. This encoding also specifies an order for the segments of the route. Such an order can be specified in a variety of ways, such as a singly or doubly linked list, a numbering scheme, etc. In some embodiments, the segments are stored in a 1-dimensional array. In these embodiments, the order of the segments is the order that they appear in the array.

The run-length encoding of a route also typically specifies at least a starting point for the route. From this starting point, a line representation of the route can be constructed as follows. The first segment $S_1$ is initially constructed as a segment that starts at the starting point and terminates a distance d away from this starting point in the first segment's direction D1. When the first segment is in a horizontal or vertical direction, the distance d equals the length $L_1$ of the first segment. On the other hand, when the first segment is in a ±45° direction, the distance d equals the length $L_1$ of the first segment times square root of 2 (i.e., $d=L_1 * \sqrt{2}$).

Each subsequent segment of the route is then constructed by performing an iterative operation. During each iteration, the operation constructs one segment, referred to as the current segment $S_C$. This current segment $S_C$ starts at the termination of the previously constructed segment $S_P$, which is before the current segment in the route in the segment order that is being constructed. The current segment $S_C$ terminates at a point that is a distance $d_C$ (where $d_C$ is the current segment's length $L_C$ when the segment is in a horizontal or vertical direction, or is the current segment's length $L_C * \sqrt{2}$ when the segment is in a ±45° direction) away from the previous segment's termination point in the current segment's direction D. This iterative operation terminates once it has constructed the last segment.

As mentioned above, some embodiments also define a style for each segment of a route. A style specifies eight values that can be used to transform a line-representation of a segment into a convex polygonal shape that represents a more complete geometric representation of the segment. These eight values include four low values, $dx_{LO}$, $dy_{LO}$, $ds_{LO}$, $dt_{LO}$, and four high values, $dx_{HI}$, $dy_{HI}$, $ds_{HI}$, and $dt_{HI}$. The low values are subtracted from the segment's lowest x-, y-, s- and t-values to obtain the low values of convex polygon that represents the segment, while the high values are added to the segment's highest x-, y-, s-, and t-values to obtain the high values of the convex polygon.

Figures 26, 27, 29:
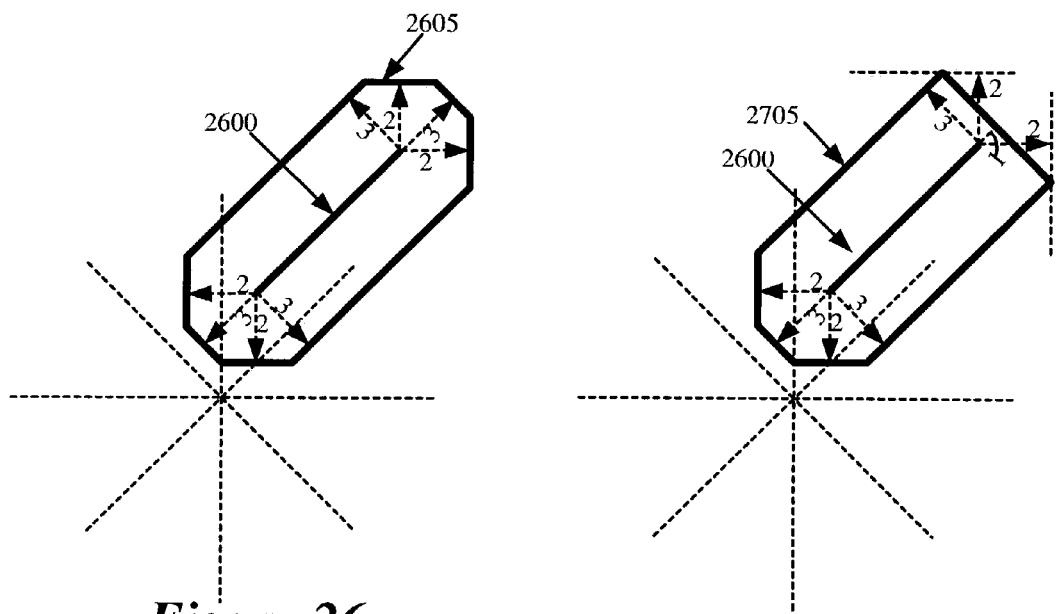
FIGS. 26 and 27 illustrate the use of two different styles for the same segment.
FIG. 29 illustrates a data structure and database arrangement that is used in some embodiments in conjunction with the process of FIG. 28.

FIGS. 26 and 27 illustrate the use of two different styles for the same segment 2600. The segment 2600 connects the x,y coordinates (1,3) and (5,7), which map to the s,t coordinates (4,2) and (12,2). In the example illustrated in FIG. 26, the style is specified by the following eight values:

$dx_{LO}=2$, $dy_{LO}=2$, $ds_{LO}=3$, $dt_{LO}=3$, $dx_{HI}=2$, $dy_{HI}=2$, $ds_{HI}=3$, $dt_{HI}=3$.

FIG. 26 illustrates that the subtraction of the style's low values from the corresponding low values of the segment 2600 identifies the following four half-planes:

$x_{LO}=-1$, $y_{LO}=1$, $s_{LO}=1$, $t_{LO}=-1$, while the addition of the style's high values from the corresponding high values of the segment 2600 identifies the following four half-planes:

$x_{HI}=7$, $y_{HI}=9$, $s_{HI}=15$, $t_{HI}=5$.

As shown in FIG. 26, these eight half planes define an octagon 2605.

In the example illustrated in FIG. 27, the style is specified by the following eight values:

$dx_{LO}=2$, $dy_{LO}=2$, $ds_{LO}=3$, $dt_{LO}=3$, $dx_{HI}=2$, $dy_{HI}=2$, $ds_{HI}=1$, $dt_{HI}=3$.

FIG. 27 illustrates that the subtraction of the style's low values from the corresponding low values of the segment 2600 identifies the following four half-planes:

$x_{LO}=-1$, $y_{LO}=1$, $s_{LO}=1$, $t_{LO}=-1$, while the addition of the style's high values from the corresponding high values of the segment 2600 identifies the following four half-planes:

$$x_{HI}=7, y_{HI}=9, s_{HI}=13, t_{HI}=5.$$

As shown in FIG. 27, these eight half planes define a hexagon 2705. Accordingly, in the example illustrated in FIGS. 26 and 27, the use of two different styles for the same segment 2600 resulted in two different convex polygonal shapes 2605 and 2705 for the segment.

Figure 28:
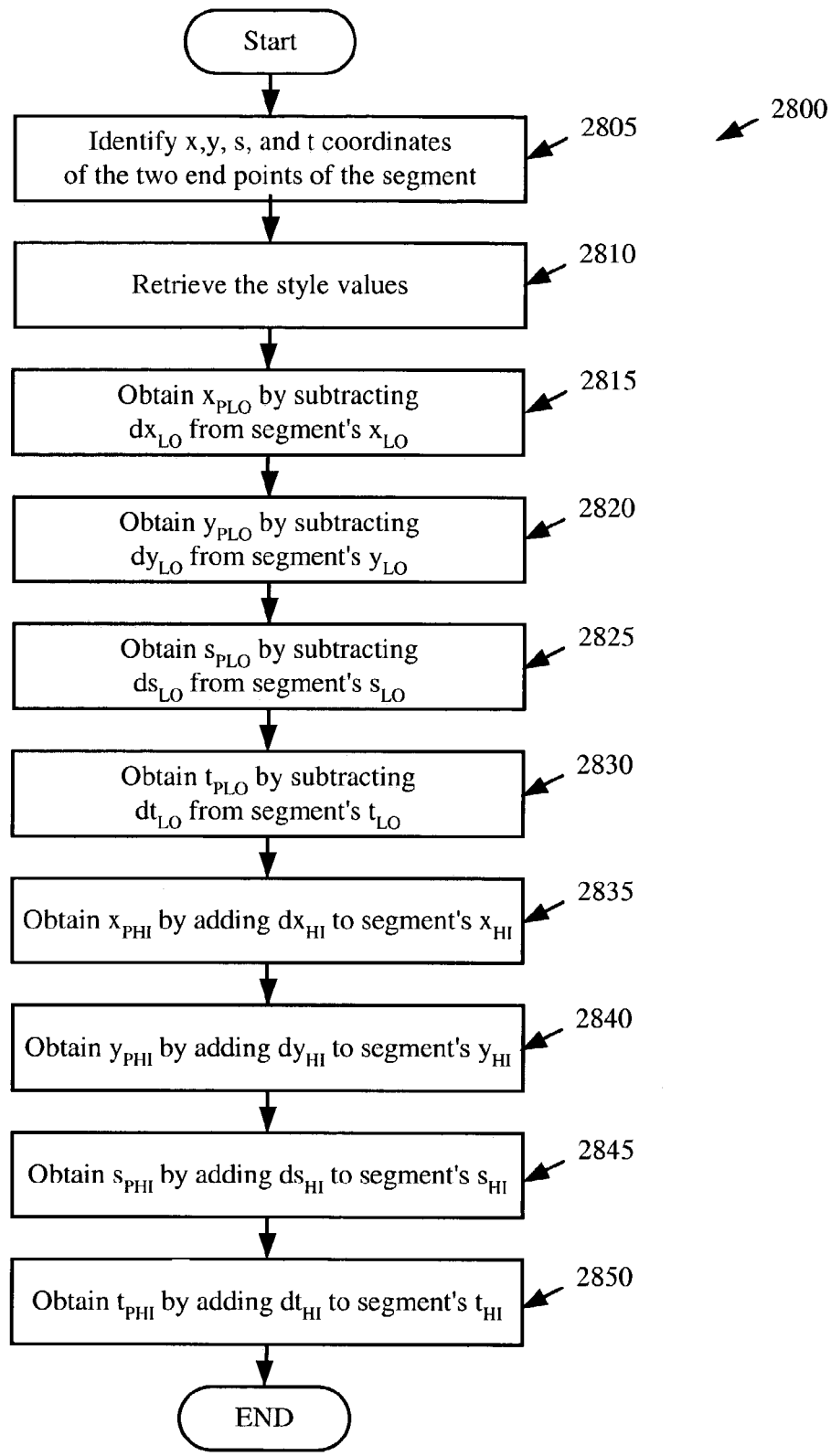
FIG. 28 illustrates a process for constructing the polygonal shape of a wire segment from its direction, length, and associated style information.

FIG. 28 illustrates a process for constructing the polygonal shape of a wire segment from its direction, length, and associated style information. This process works in conjunction with a data structure and database arrangement illustrated in FIG. 29. FIG. 29 illustrates that a segment is represented as a segment data structure 2905 that stores the length and direction of the segment, and potentially other segment identifying indicia, such as relational data that specifies the order of the segment in the segment's route. As shown in this figure, the segment data structure also includes an index 2910 that identifies a record 2920 in a style table 2915. Each record in the style table 2915 is identifiable by a unique style index 2910. Also, each record specifies a unique set of 8 delta values, $dx_{LO}$, $dy_{LO}$, $ds_{LO}$, $dt_{LO}$, $dx_{HI}$, $dy_{HI}$, $ds_{HI}$, and $dt_{HI}$.

As shown in FIG. 28, the process 2800 initially identifies (at 2805) the x-, y-, s-, and t-coordinates of the start and end points of the segment from the segment's start coordinate, direction, and length. As mentioned above, a particular segment's start coordinate is the termination coordinate of the previous segment in the route, unless the particular segment is the first segment, in which case its start coordinate is the start point of the route. The segment's end point is a point that is a distance d away from the segment's start point in the segment's direction D. As mentioned above, the distance d is the segment's length L when the segment is in a horizontal or vertical direction, or is the segment's length times square root of 2 (L*√2) when the segment is in a ±45° direction.

The process then retrieves (at 2810) the delta values ($dx_{LO}$, $dy_{LO}$, $ds_{LO}$, $dt_{LO}$, $dx_{HI}$, $dy_{HI}$, $ds_{HI}$, and $dt_{HI}$) associated with the style of the segment. It then computes (at 2815) the x-low value $X_{PLO}$ of the polygon that is to represent the segment by subtracting $dx_{LO}$ from the segment's $X_{LO}$. The process next computes (at 2820) the y-low value $y_{PLO}$ of the polygon by subtracting $dy_{LO}$ from the segment's $y_{LO}$. It then computes (at 2825) the s-low value $s_{PLO}$ of the polygon by subtracting $ds_{LO}$ from the segment's $s_{LO}$. The process next computes (at 2830) the t-low value $t_{PLO}$ of the polygon by subtracting $dt_{LO}$ from the segment's $t_{LO}$.

The process then computes (at 2835) the x-high value $X_{PHI}$ of the polygon that is to represent the segment by adding $dx_{HI}$ to the segment's $X_{HI}$. The process next computes (at 2840) the y-high value $y_{PHI}$ of the polygon by adding $dy_{HI}$ to the segment's $y_{HI}$. It then computes (at 2845) the s-high value $s_{PHI}$ of the polygon by adding $ds_{HI}$ to the segment's $s_{HI}$. The process next computes (at 2850) the t-high value $t_{PHI}$ of the polygon by adding $dt_{HI}$ to the segment's $t_{HI}$. The computed parameters $x_{PLO}$, $y_{PLO}$, $s_{PLO}$, $t_{PLO}$, $X_{PHI}$, $Y_{PHI}$, $S_{PHI}$, and $t_{PHI}$ for the polygon define the shape of the polygon. Accordingly, these values can be stored in an octangle data structure to represent the polygon.

The process 2800 can be used in a variety of different scenarios when it is desirable to specify the actual geometry of the routes from their segment and style information. For instance, this process could be used to generate a display of the routes, to output data to a GDS file, to perform extraction, to estimate routing capacity, etc.

Figure 30:
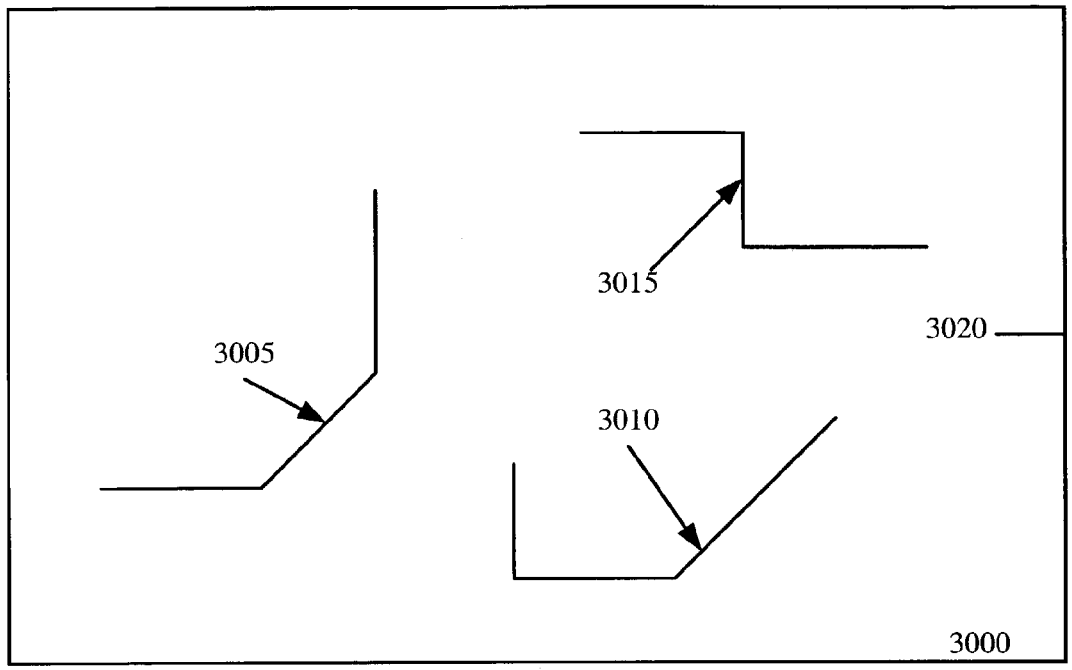
FIG. 30 illustrates two different view of a design layout.
Figure 30:
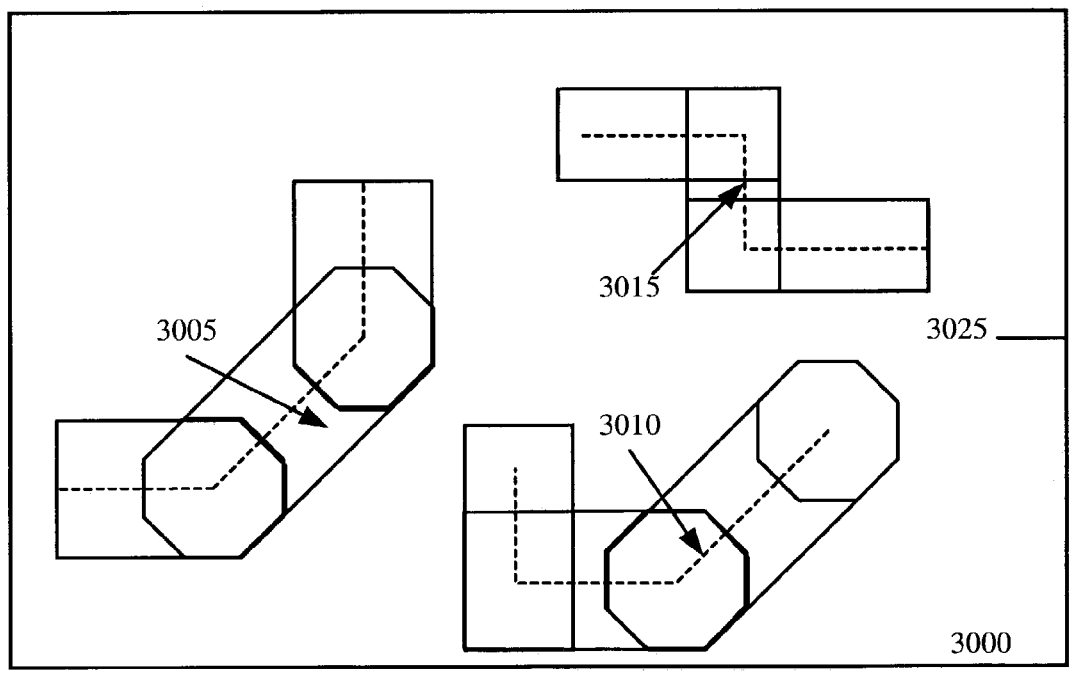

FIG. 30 illustrates two different views of a design layout 3000 that includes three routes 3005, 3010, and 3015. The first view 3020 illustrates each route in terms of a set of line segments that are abutting. The second view 3025 illustrates each route in terms of a set of polygons that partially overlap. Each of the polygons in the second view corresponds to a particular segment in the first view. As described above by reference to FIG. 28, each particular polygon in the second view can be generated from its corresponding segment by applying the delta parameters of the segment's associated style to the style's endpoint values. Hence, to store efficiently the routes illustrated in FIG. 30, some embodiments (1) store each route in terms of the route's set of segments, and (2) as illustrated in FIG. 29, specify each segment in terms of its length, direction, and style-table index. The style table index of a segment, in turn, identifies a set of delta parameters, which when applied to the segment's endpoints specify eight half planes that define the segment's polygonal shape.

Figure 31:
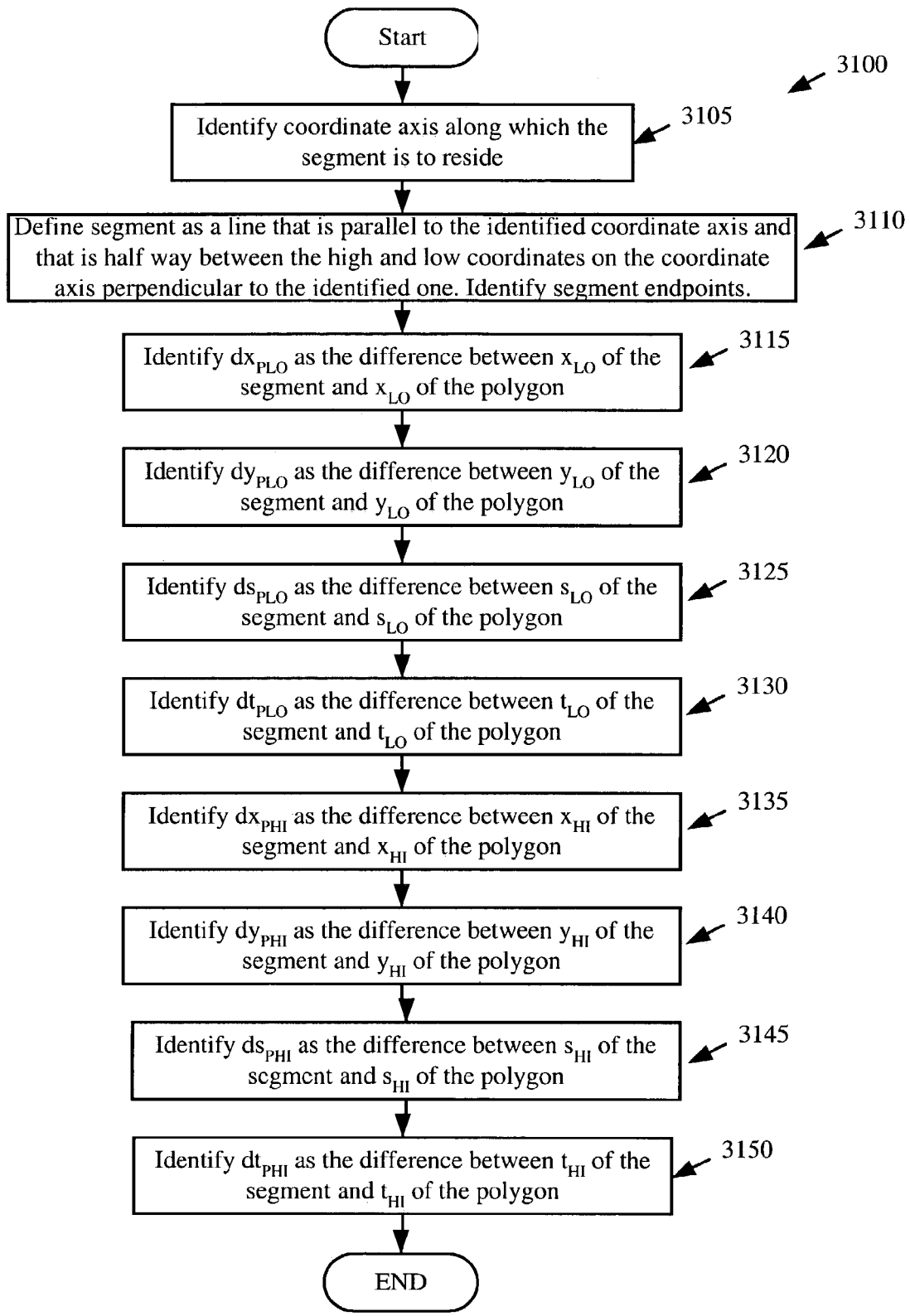
FIGS. 31 and 32 illustrate a process that generates the segment and style information from a polygon that represents a route segment.

FIG. 31 illustrates a process 3100 that generates the segment and style information from a polygon that represents a route segment. An EDA tool performs this process when the tool does not have the style and segment information. For instance, a power router might perform such an operation if it does not use a pre-defined style for the routes that it defines. It should be noted that when an EDA tool has the style and/or segment information associated with a polygonal representation of a route, the tool simply generates the needed segment and style information from the eight half planes that represent the polygon and the available segment and style information.

Figure 32:
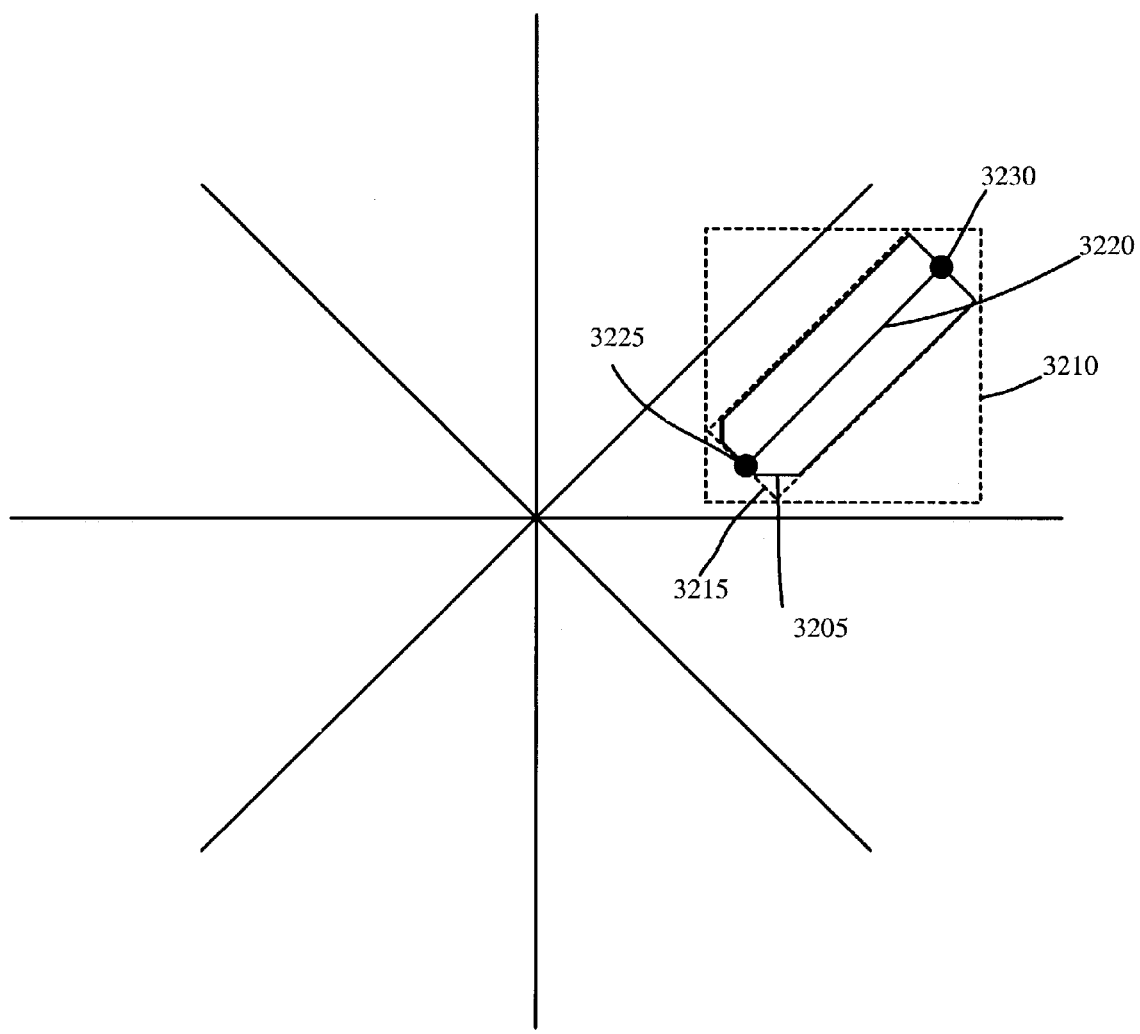

As shown in FIG. 31, the process 3100 initially identifies (at 3105) the coordinate axis that will be parallel to the segment that the process will define for the polygon that represents the route segment. FIG. 32 illustrates how some embodiments identify this coordinate axis. This figure illustrates a polygon 3205 for which segment and style data needs to be generated. For the polygon 3205, some embodiments identify the Manhattan bounding box 3210 and 45°-rotated bounding box 3215 that enclose the polygon. These bounding polygons can be identified according to the approach described above, which is further elaborated in the above-incorporated non-provisional patent application.

These embodiments next identify the bounding box with the smallest area, and then based on the identified bounding box, specify the coordinate axis along which the route segment will be defined. For instance, when the Manhattan bounding box has the smaller area, then the process 3100 determines (at 3105) whether the polygon's width is longer along the x-axis than its width along the y-axis. If so, the process identifies (at 3105) the x-axis as the coordinate axis. Otherwise, the process identifies (at 3105) the y-axis as the coordinate axis. On the other hand, when the 45°-rotated bounding box has the smaller area, then the process determines (at 3105) whether the polygon's width is longer along the s-axis than its width along the t-axis. If so, the process identifies (at 3105) the s-axis as the coordinate axis. Otherwise, the process identifies (at 3105) the t-axis as the coordinate axis. In the example illustrated in FIG. 32, the rotated bounding box 3215 has the smaller area and the polygon's width along the s-axis is larger than its width along the t-axis. Accordingly, the s-axis is identified (at 3105) as the coordinate axis for the segment that is to be defined for the polygon 3205.

After identifying the coordinate axis at 3105, the process defines (at 3110) the segment as a line that is parallel to the identified coordinate axis, and that is half way between the polygon's high and low coordinates on the coordinate axis perpendicular to the identified axis. At this stage, the process also specifies (at 3110) the x-, y-, s-, and t-coordinate values of the two endpoints of the segment. These two endpoints are two points on the boundary of the polygon that are intersected by the defined segment (i.e., are intersected by a line that is parallel to the identified coordinate axis and that is half way between the polygon's high and low coordinates on the coordinate axis perpendicular to the identified axis). For instance, in the example illustrated in FIG. 32, the segment 3220 is identified to be parallel to the s-axis and half way between the high and low t-axis coordinates of the polygon 3205. The endpoints of the segment 3220 are points 3225 and 3230.

The process then identifies the 8 delta values, $dx_{LO}$, $dy_{LO}$, $ds_{LO}$, $dt_{LO}$, $dx_{HI}$, $dy_{HI}$, $ds_{HI}$, and $dt_{HI}$, associated with the style. Specifically, it computes (at 3115) the low delta x-value $dx_{LO}$ by subtracting the polygon's x-low value $x_{PLO}$ from the x-low value $x_{LO}$ of the segment. The process then computes (at 3120) the low delta y-value $dy_{LO}$ by subtracting the polygon's y-low value $y_{PLO}$ from the y-low value $y_{LO}$ of the segment. It then computes (at 3125) the low delta s-value $ds_{LO}$ by subtracting the polygon's s-low value $s_{PLO}$ from the s-low value $s_{LO}$ of the segment. The process next computes (at 3130) the low delta t-value $dt_{LO}$ by subtracting the polygon's t-low value $tp_{LO}$ from the t-low value $t_{LO}$ of the segment.

The process then computes (at 3135) the high delta x-value $dx_{HI}$ by subtracting the x-high value $x_{HI}$ of the segment from the polygon's x-high value $X_{PHI}$. It next computes (at 3140) the high delta y-value $dy_{HI}$ by subtracting the y-high value $y_{HI}$ of the segment from the polygon's y-high value $y_{PHI}$. The process then computes (at 3145) the high delta s-value $ds_{HI}$ by subtracting the s-high value $S_{HI}$ of the segment from the polygon's s-high value $S_{PHI}$. It next computes (at 3150) the high delta t-value $dt_{HI}$ by subtracting the t-high value $t_{HI}$ of the segment from the polygon's t-high value $t_{PHI}$.

The computed delta values $dx_{LO}$, $dy_{LO}$, $ds_{LO}$, $dt_{LO}$, $dx_{HI}$, $dy_{HI}$, $ds_{HI}$, and $dt_{HI}$ define a style, which can be stored and indexed in a database table, such as table 2915 of FIG. 29. This style can be indexed by a segment data structure (such as structure 2905 of FIG. 29) for the segment specified at 3110. The direction of this segment would be one of the two directions parallel to the coordinate axis identified at 3105. The length of this segment would be the distance between the two endpoints of the segment.

III. Computer System

Figure 33:
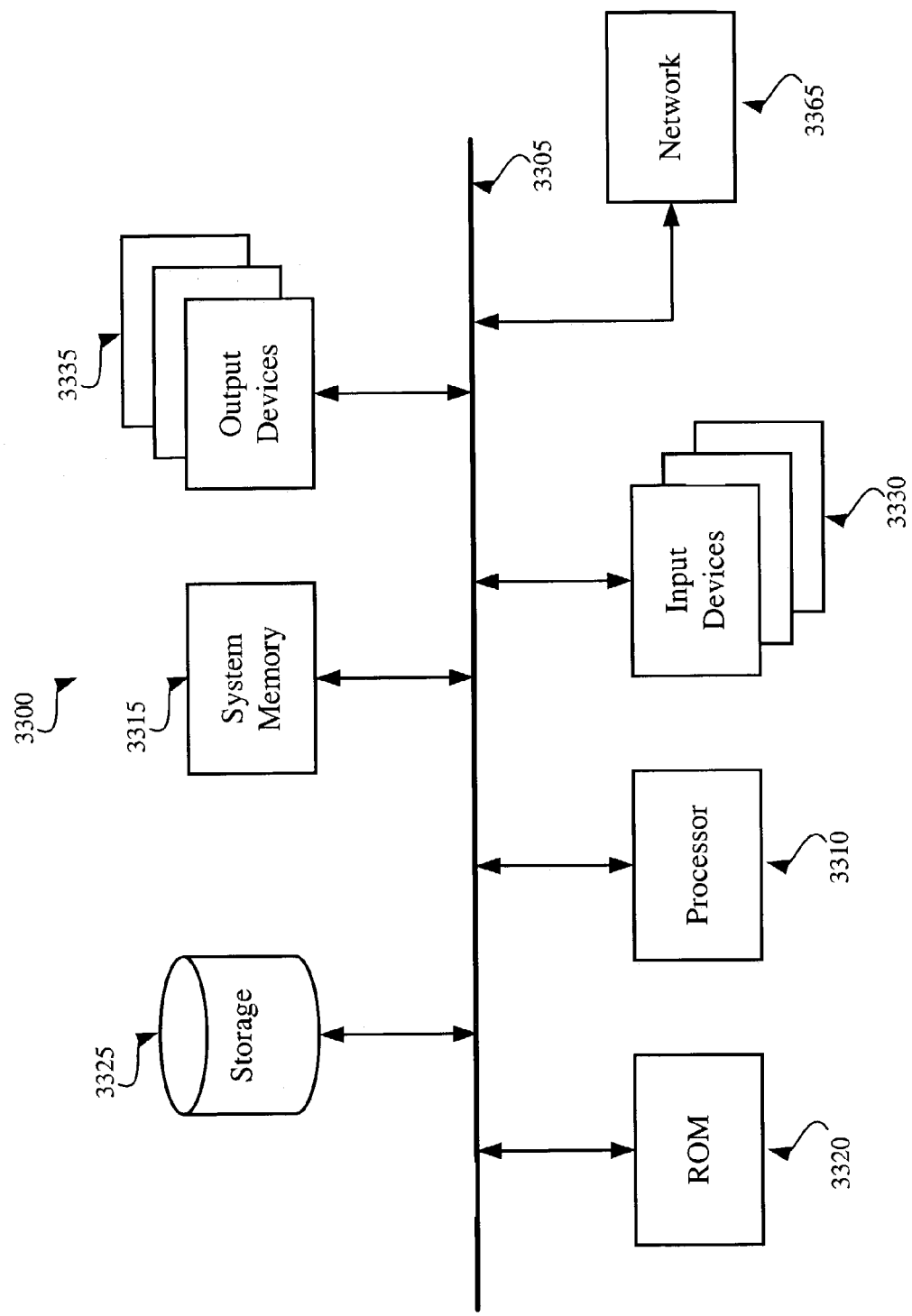
FIG. 33 conceptually illustrates a computer system with which some embodiments of the invention are implemented.

FIG. 33 conceptually illustrates a computer system with which some embodiments of the invention are implemented. Computer system 3300 includes a bus 3305, a processor 3310, a system memory 3315, a read-only memory 3320, a permanent storage device 3325, input devices 3330, and output devices 3335.

The bus 3305 collectively represents all system, peripheral, and chipset buses that communicatively connect the numerous internal devices of the computer system 3300. For instance, the bus 3305 communicatively connects the processor 3310 with the read-only memory 3320, the system memory 3315, and the permanent storage device 3325.

From these various memory units, the processor 3310 retrieves instructions to execute and data to process in order to execute the processes of the invention. The read-only memory (ROM) 3320 stores static data and instructions that are needed by the processor 3310 and other modules of the computer system. The permanent storage device 3325, on the other hand, is read-and-write memory device. This device is a non-volatile memory unit that stores instruction and data even when the computer system 3300 is off. Some embodiments of the invention use a mass-storage device (such as a magnetic or optical disk and its corresponding disk drive) as the permanent storage device 3325. Other embodiments use a removable storage device (such as a floppy disk or zip® disk, and its corresponding disk drive) as the permanent storage device. Like the permanent storage device 3325, the system memory 3315 is a read-and-write memory device. However, unlike storage device 3325, the system memory is a volatile read-and-write memory, such as a random access memory. The system memory stores some of the instructions and data that the processor needs at runtime. In some embodiments, the invention's processes are stored in the system memory 3315, the permanent storage device 3325, and/or the read-only memory 3320.

The bus 3305 also connects to the input and output devices 3330 and 3335. The input devices enable the user to communicate information and select commands to the computer system. The input devices 3330 include alphanumeric keyboards and cursor-controllers. The output devices 3335 display images generated by the computer system. For instance, these devices display IC design layouts. The output devices include printers and display devices, such as cathode ray tubes (CRT) or liquid crystal displays (LCD).

Finally, as shown in FIG. 33, bus 3305 also couples computer 3300 to a network 3365 through a network adapter (not shown). In this manner, the computer can be a part of a network of computers (such as a local area network ("LAN"), a wide area network ("WAN"), or an Intranet) or a network of networks (such as the Internet). Any or all of the components of computer system 3300 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. For instance, some embodiments might also include a layer attribute in the octangle data structure 205 of FIG. 2, while other embodiments might specify the layer information in some other manner.

Also, several of the above-described embodiments use the octangle data structure 205, which is useful to represent design-layout items with horizontal, vertical, and ±45° directions. Other embodiments, however, might use other types of data structures that are optimized for other types of design-layout items.

For example, some embodiments define routes according to a hexagonal wiring model that specifies three routing directions that are offset from each other by 60°. For such a wiring model, some embodiments use a hexangle data structure 3400 that is illustrated in FIG. 34. This data structure stores eight values that are defined with respect to a hexagonal coordinate system 3500 illustrated in FIG. 35. As shown in FIG. 35, the hexagonal coordinate system includes a Manhattan coordinate system and a rotated coordinate system. The rotated coordinate system includes u- and v-axes. The u-axis is at a 60° clockwise rotation from the y-axis, while the v-axis is at a 60° counterclockwise rotation from the y-axis. The hexangle data structure represents each convex geometric shape in terms of eight values, $x_{LO}$, $y_{LO}$, $u_{LO}$, $v_{LO}$, $x_{HI}$, $y_{HI}$, $u_{HI}$, and $v_{HI}$. These eight values define eight half planes that bound a design-layout item in the Manhattan and rotated coordinate systems. The eight values are useful in representing design-layout items (such as pins) that have sides in the Manhattan and ±30° directions (where 30° is defined with respect to the Manhattan coordinate system). In addition, the y-, u-, and v-values are useful in representing routes that have segments parallel to the y-, u-, and v-axis.

In some cases, the hexagonal wiring model specifies the x-axis as one of the routing directions. In these cases, the three routing directions are 0°, 60°, and −60°. In these cases, the u- and v-values of the hexangle data structure 3400 would be defined by reference to the coordinate system of FIG. 36. This coordinate system is similar to the coordinate system 3500 of FIG. 35, except that the u'- and v'-axes in FIG. 36 are rotated by 60° with respect to the x-axis.

Alternatively, instead of specifying a data structure that is optimized for one of the two potential hexagonal wiring models mentioned above, some embodiments use a symmetric-hexangle data structure 3700 illustrated in FIG. 37. This data structure is defined for the coordinate system of FIG. 38, which includes a Manhattan coordinate system, a 30'-rotated coordinate system, and a 60'-rotated coordinate system. The 30'-rotated coordinate system includes two axes, u- and v-axes, that are rotated by 30° with respect to the x-axis (i.e., are rotated by 60° with respect to the y-axis). The 60°-rotated coordinate system includes two axes, u'- and v'-axes, that are rotated by 60 with respect to the x-axis.

The symmetrical hexangle data structure 3700 represents each convex geometric shape in terms of twelve values, $x_{LO}$, $y_{LO}$, $u_{LO}$, $v_{LO}$, $u'_{LO}$, $v'_{LO}$, $x_{HI}$, $y_{HI}$, $u_{HI}$, $v_{HI}$, $u'_{HI}$, and $v'_{HI}$. These twelve values define twelve half planes that bound a design-layout item in the three sub-coordinate systems of the coordinate system of FIG. 38. The twelve values are useful in representing design-layout items (such as pins or routes) that might have sides in the Manhattan, ±30°, and ±60° directions. Thus, one of ordinary skill in the art would understand that the invention is not to be limited by the foregoing illustrative details, but rather is to be defined by the appended claims.

We claim:

1. A method of specifying routes in a design layout, wherein each route has a set of segments, wherein each segment has a shape, the method comprising:
   a) receiving a route;
   b) for each segment of the received route, identifying n half planes that when intersected provide the shape of the segment, wherein n is an integer greater than 4.

2. The method of claim 1, wherein identifying n half planes for a particular segment comprises:
   retrieving, from a data storage, n values that identify the n half-planes.

3. The method of claim 2, wherein each segment of the received route has an associated data-storage index, wherein the data-storage index identifies the n values in the data storage.

4. The method of claim 3,
   wherein each particular segment has first and second endpoints,
   wherein the set of n values for a particular segment identify n delta values, said n delta values used in combination with said first and second endpoints for identifying said n half planes.

5. A method of generating a representation of a route formed by a plurality of adjoining polygons, the method comprising:
   for each polygon:
   identifying a direction for the polygon,
   defining a segment along the identified direction, wherein the segment has a starting point and an ending point,
   identifying more than four values that specify more than four half planes in conjunction with the starting and ending points of the segment, wherein the intersection of the specified half planes provides the shape of the polygon.

6. A design layout having a plurality of routes,
   wherein each route is represented by a set of segments,
   wherein each segment has an associated shape,
   wherein the shape of each particular segment is specified by a data-storage index for the particular segment,
   wherein each particular data storage index identifies a particular set of n values that are stored in a data storage,
   wherein each particular set of n values represents n half planes, said n half planes when intersected provide the shape of the particular segment,
   wherein n is an integer greater than 4.

7. The design layout of claim 6, wherein each segment further has a length.

8. The design layout of claim 6, wherein at least two segments have different data-storage indices that identify different sets of n values, and wherein at least two segments have identical data-storage indices that identify the same set of n values.

9. The design layout of claim 6, wherein the set of n values for a particular segment identify n half-planes that when intersected specify the shape of the particular segment.

10. The design layout of claim 9, wherein each particular segment has first and second endpoints, wherein the set of n values for a particular segment identify n delta values that in combination with the first and second endpoints of the particular segment identify the n half-planes that when intersected specify the shape of the particular segment.

11. The design layout of claim 10, wherein the first and second endpoints of at least one segment are the same point.

12. A computer readable medium storing a computer program for specifying routes in a design layout, wherein each route has a set of segments, wherein each segment has a shape, the computer program comprising sets of instructions for:
   a) receiving a route;
   b) for each segment of the received route, identifying n half planes that when intersected provide the shape of the segment, wherein n is an integer greater than 4.

13. The computer readable medium of claim 12, wherein the set of instructions for identifying n half planes for a particular segment comprises:
   a set of instructions for retrieving, from a data storage, n values that identify the n half-planes.

14. The computer readable medium of claim 13, wherein each segment of the received route has an associated data-storage index, wherein the data-storage index identifies the n values in the data storage.

15. The computer readable medium of claim 14,
   wherein each particular segment has first and second endpoints,
   wherein the set of n values for a particular segment identify n delta values, said n delta values used in combination with said first and second endpoints for identifying said n half planes.

16. A computer readable medium storing a computer program for generating a representation of a route formed by a plurality of adjoining polygons, the computer program comprising sets of instructions for:
 for each polygon:
  identifying a direction for the polygon,
  defining a segment along the identified direction, wherein the segment has a starting point and an ending point,
  identifying more than four values that specify more than four half planes in conjunction with the starting and ending points of the segment, wherein the intersection of the specified half planes provides the shape of the polygon.

\* \* \* \* \*